United States Patent
Hiraga

(10) Patent No.: US 6,218,881 B1
(45) Date of Patent: Apr. 17, 2001

(54) SEMICONDUCTOR INTEGRATED CIRCUIT DEVICE

(75) Inventor: Noriaki Hiraga, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/119,746

(22) Filed: Jul. 21, 1998

(30) Foreign Application Priority Data

Jul. 23, 1997 (JP) .................................................... 9-196667

(51) Int. Cl.[7] .................................................... H02H 3/22
(52) U.S. Cl. ........................ 327/310; 327/309; 327/433; 327/438; 357/358
(58) Field of Search .................................... 327/310, 309, 327/306, 313, 314, 321, 438, 433, 437; 357/147, 152, 355, 358, 139

(56) References Cited

U.S. PATENT DOCUMENTS

| | | | |
|---|---|---|---|
| 4,066,915 | * | 1/1978 | Ohhinata ............................... 327/438 |
| 4,678,933 | * | 7/1987 | Pedone ................................. 327/439 |
| 4,819,047 | * | 4/1989 | Gilfeather et al. ................. 357/23.13 |
| 5,734,541 | * | 3/1998 | Iniewski et al. ..................... 361/111 |

* cited by examiner

*Primary Examiner*—Dinh T. Le
(74) *Attorney, Agent, or Firm*—Arent Fox Kintner Plotkin & Kahn, PLLC

(57) ABSTRACT

A semiconductor integrated circuit device has an output circuit formed in a CMOS structure and composed of a P-channel MOS transistor that has its gate connected to an input terminal, has its source connected to a power source line, and has its drain connected to an output terminal and an N-channel MOS transistor that has its gate connected to the input terminal, has its source connected to ground, and has its drain connected to the output terminal. A first protection diode is formed in parallel with the source-drain channel of the P-channel MOS transistor. A first NPN-type transistor is so formed that its base is connected to ground and its collector-emitter path is connected in parallel with the source-drain channel of the P-channel MOS transistor. A second protection diode is formed in parallel with the source-drain channel of the N-channel MOS transistor. A thyristor circuit is provided in parallel with the source-drain channel of the N-channel MOS transistor. This thyristor circuit operates only when abnormal electrostatic charge is applied to the output terminal.

6 Claims, 5 Drawing Sheets

SEMICONDUCTOR INTEGRATED CIRCUIT DEVICE

BACKGROUND OF THE INVENTION

1. Field of the Invention

The present invention relates to a semiconductor integrated circuit device such as an LSI (large-scale integrated circuit).

2. Description of the Prior Art

In a semiconductor integrated circuit device such as an LSI, the output circuit constituting a part of each I/O cell is typically formed in a CMOS structure. Such output circuits may suffer electrostatic destruction when fed with abnormal electrostatic charge by way of their output terminal from the outside, and therefore they are usually provided with a protection circuit against static electricity.

In a conventional example shown in FIG. 5, a P-channel MOS transistor 101 and an N-channel MOS transistor 102 are connected between a power source line 106 and ground GND, with their gates connected to an input terminal 100 and their drains connected to an output terminal 103. In addition, diodes 104 and 105 are provided for protection. The diode 104 is turned on when abnormal positive electrostatic charge is applied to the output terminal 103 from the outside, so that the electrostatic charge is bypassed to the power source line 106. Meanwhile, the diode 105 remains off.

The diode 105 is turned on when abnormal negative electrostatic charge is applied to the output terminal 103, so that a current flows from ground to the output terminal 103 to discharge the electrostatic charge at the output terminal 103. These diodes 104 and 105 are, conventionally, formed separately from the transistors 101 and 102 on a semiconductor substrate.

In FIG. 6, blocks 111 and 112 are formed on a single semiconductor substrate. The block 111 includes a P-channel MOS transistor 101 and a diode 104, and the block 112 includes an N-channel MOS transistor 102 and a diode 105. The drains of the transistors 101 and 102, the anode of the diode 104, and the cathode of the diode 105 are connected together with a wire 107.

It is a well-known disadvantage of this type of output circuit that the CMOS transistors form parasitic bipolar transistors that act as thyristors. Such parasitic transistors cause a condition called "latchup", and thereby induce malfunctioning of the CMOS transistors.

To avoid the formation of such parasitic transistors that act as thyristors, it has been customary to secure a sufficient interval 108 between adjacent blocks ill and 112. On the other hand, the protection provided by the protection circuit composed simply of diodes 104 and 105 has been insufficient to cope with extremely high electrostatic charge applied to the output circuit 103.

SUMMARY OF THE INVENTION

An object of the present invention is to provide a semiconductor integrated circuit device that is highly reliable by being securely protected against electrostatic charge.

Another object of the present invention is to provide a semiconductor integrated circuit device that is securely protected against electrostatic charge without unduly increasing the space for output circuits.

To achieve the above objects, according to one aspect of the present invention, a semiconductor integrated circuit device having an output circuit of a CMOS structure type composed of a P-channel MOS transistor that has its gate connected to an input terminal, has its source connected to a power source line, and has its drain connected to an output terminal and an N-channel MOS transistor that has its gate connected to the input terminal, has its source connected to ground, and has its drain connected to the output terminal is further provided with: a first protection diode formed in parallel with the source-drain channel of the P-chaninel MOS transistor; a first NPN-type transistor formed so that its base is connected to ground and its collector-emitter path is connected in parallel with the source-drain channel of the P-channel MOS transistor; a second protection diode formed in parallel with the source-drain channel of the N-channel MOS transistor; and a thyristor circuit formed in parallel with the source-drain channel of the N-channel MOS transistor and operating only when abnormal electrostatic charge is applied to the output terminal.

In this structure, for example, the first protection diode and the thyristor circuit are turned on when abnormal positive electrostatic charge is applied to the output terminal, and, for example, the second protection diode and the first NPN-type transistor are turned on when abnormal negative electrostatic charge is applied to the output terminal. Thus, not only the protection diodes but also the first NPN-type transistor and the thyristor circuit are turned on to discharge the electrostatic charge, and this helps improve the resistance to electrostatic charge accordingly.

Moreover, according to another aspect of the present invention, the first protection diode and the thyristor circuit are formed between the P-channel MOS transistor and the N-channel MOS transistor on a semiconductor substrate.

In a conventional CMOS-type output circuit, a P-channel MOS transistor and an N-channel MOS transistor are formed with a sufficient interval between them to suppress the action of a parasitically formed thyristor circuit. By contrast, according to the present invention, such a parasitically formed thyristor circuit is used intentionally as a protection circuit, and therefore there is no need to unduly increase the chip area.

Moreover, according to another aspect of the present invention, the thyristor circuit is composed of a PNP-type transistor that has its base connected to the power source line, has its emitter connected to the output terminal, and has its collector connected through a resistor to ground and a second NPN-type transistor that has its base connected to the resistor, has its collector connected to the base of the PNP-type transistor, and has its emitter connected to ground.

Since the second NPN-type transistor has its base connected through the resistor to ground, its base voltage is stably kept at the ground level, and therefore it is never turned on under normal conditions. Even if the PNP-type transistor is turned on, its output current is so low that the voltage appearing across the resistor and thus applied to the base of the second NPN-type transistor is too low to reach the threshold voltage of this transistor.

Moreover, according to another aspect of the present invention, the first protection diode is formed between an N well formed in a P⁻ substrate and a P⁺ region formed within the N well. The PNP-type transistor of the thyristor circuit is formed as a parasitic transistor by the P⁺ region, the N well, and the P⁻ substrate. The second NPN-type transistor of the thyristor circuit is formed as a parasitic transistor by the source region of the N-channel MOS transistor, the P⁻ substrate, and the N well.

That is, both the PNP-type transistor and the second NPN-type transistor constituting the thyristor are formed as parasitic transistors by the use of the N well, the P+ region, and others that serve to form the first protection diode. This helps minimize the space required to form the protection diode and the thyristor circuit.

According to still another aspect of the present invention, the second protection diode is formed between a second P+ region and an N+ region formed in the P− substrate, and the first NPN-type transistor is formed as a parasitic transistor by the second P+ region, the N+ region, and the N well for the P-channel MOS transistor.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
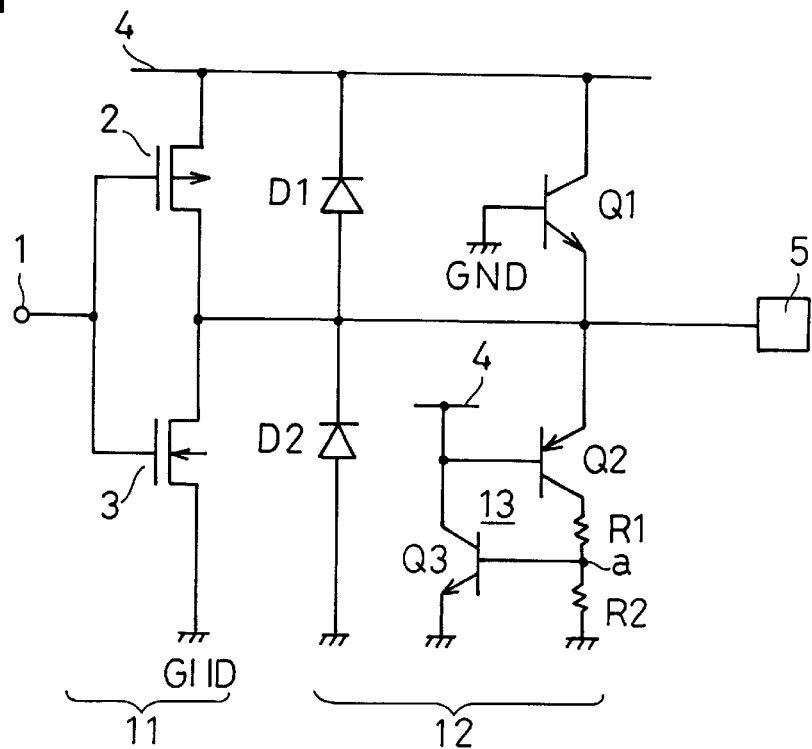
FIG. 1 is a circuit diagram illustrating the output circuit of a semiconductor integrated circuit device embodying the present invention.

Hereinafter, an embodiment of the present invention will be described with reference to the drawings. In FIG. 1, numeral 1 represents an input terminal of an output circuit provided within a semiconductor integrated circuit device, and numerals 2 and 3 represent a P-channel MOS transistor and an N-channel MOS transistor constituting an output circuit section 11 formed in a CMOS structure.

The P-channel MOS transistor 2 has its base connected to the input terminal 1, has its source connected to a power source line 4, and has its drain connected to an output terminal 5. On the other hand, the N-channel MOS transistor similarly has its base connected to the input terminal 1 and has its drain connected to the output terminal 5, but has its source connected to ground (a ground line) GND.

Numeral 12 represents a protection circuit for protecting the output circuit section 11 against electrostatic charge and the like applied to the output terminal 5 from the outside. As shown in the figure, the protection circuit 12 is composed of diodes D1 and D2, bipolar transistors Q1, Q2, and Q3, resistors R1 and R2. The transistors Q2 and Q3 and the resistors R1 and R2 constitute a thyristor circuit 13. The diode D1 has its anode connected to the output terminal 5 and has its cathode connected to the power source line 4. The diode D2 has its cathode connected to the output terminal 5 and has its anode connected to ground GND.

The transistor Q1, which is of the NPN type, has its base connected to ground GND, has its collector connected to the power source line 4, and has its emitter connected to the output terminal 5. The transistor Q2, which is of the PNP type, has its emitter connected to the output terminal 5, has its base connected to the power source line 4, and has its collector connected through the resistors R1 and R2 to ground GND. The transistor Q3, which is of the NPN type, has its base connected to the node a between the resistors R1 and R2, has its collector connected to the power source line 4, and has its emitter connected to ground GND. Here, the transistors Q2 and Q3 are connected in a thyristor-like fashion.

As long as the output circuit shown in FIG. 1 is operating normally, the output circuit section 11 performs normal output operations as are expected in a CMOS structure. Specifically, when a high level is applied to the input terminal 1, the transistor 2 is turned off, and the transistor 3 is turned on, causing a low level to appear at the output terminal 5. By contrast, when a low level is applied to the input terminal 1, the transistor 2 is turned on, and the transistor 3 is turned off, causing a high level to appear at the output terminal 5.

When abnormal electrostatic charge is applied to the output terminal 5 from the outside, the protection circuit 12 operates in the following manner. Abnormal electrostatic charge is produced, for example, when a person touches the output terminal 5 with his finger, and in particular when the output circuit is in an inactive state (i.e. when no voltage is present on the power source line 4). When high negative electrostatic charge is applied to the output terminal 5, the transistor Q1 is turned on, so that a current flows from the power source line 4 to the output terminal 5, and simultaneously the diode D2 is also turned on, so that a current flows from ground GND to the output terminal 5. As a result, the negative electrostatic charge is discharged quickly, and is therefore allowed no time to exert any effect on the output circuit section 11. Meanwhile, the diode D1 and the transistors Q2 and Q3 remain off.

When high positive electrostatic charge is applied to the output terminal 5, whereas the diode D2 and the transistor Q1 remain off, the diode D1 and the transistors Q2 and Q3 are turned on, so that the electrostatic charge at the output terminal 5 is bypassed to the power source line 4 and to ground. Thus, the output circuit section 11 is protected also against positive electrostatic charge applied to the output terminal 5.

As long as the output circuit section 11 is operating normally, the voltage at the output terminal is small, and therefore the transistors Q2 and Q3 are never turned on. That is, under normal conditions, the emitter voltage of the transistor Q2 never becomes sufficiently high relative to the power source voltage that is applied to the base of the transistor Q2, and therefore the transistor Q2, and thus the transistor Q3, is never turned on. Even if the transistor Q2 is turned on, the collector current of the transistor Q2 is so low that the voltage appearing at the node a never becomes higher than the threshold voltage of the transistor Q3.

By contrast, when high positive electrostatic charge is applied to the output terminal 5, the transistor Q2 is turned on, and its collector current becomes so high that a voltage exceeding the threshold voltage of the transistor Q3 appears at the node a and causes the transistor Q3 to be also turned on. The transistor Q3, once turned on, serves to keep the transistor Q2 on by biasing it toward its on state (the effect resulting from the thyristor-like structure). In this way, not only the diode D1 but also the transistors Q2 and Q3 are turned on to quickly discharge the positive electrostatic charge on the output terminal, so that the output circuit section 11 is not affected in any way.

Figure 2:
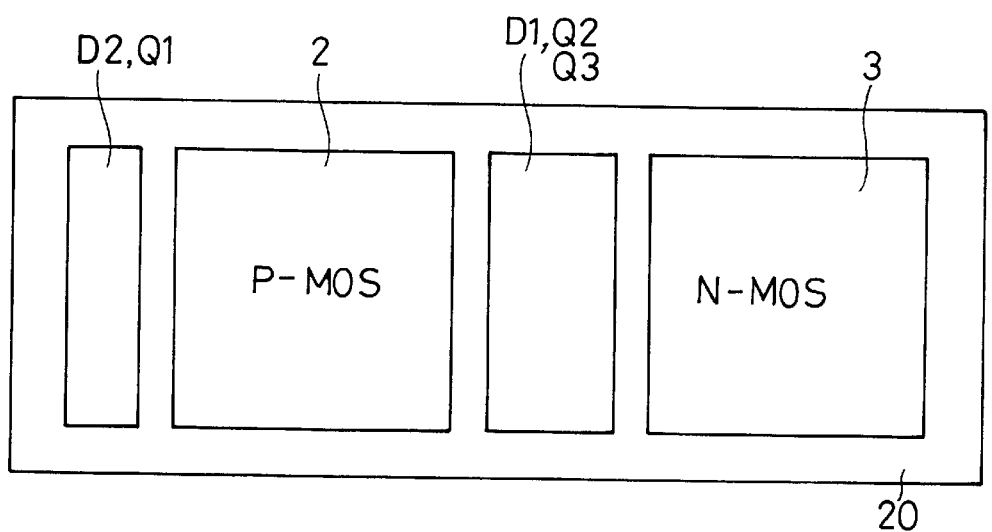
FIG. 2 is a diagram illustrating the arrangement of the elements constituting the protection circuit within the output circuit of the embodiment.
Figure 6:
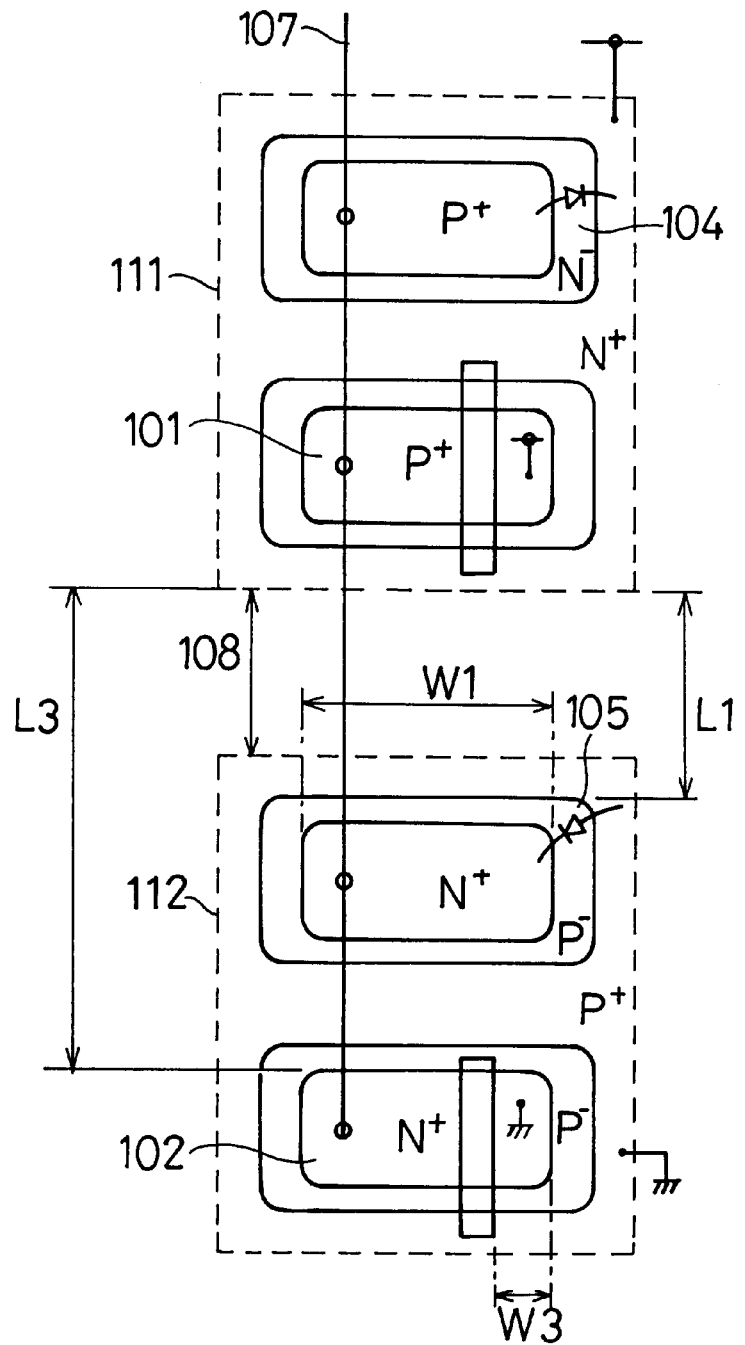
FIG. 6 is a diagram illustrating the arrangement of elements in the conventional example.

Next, a description will be given as to the structure of the circuit shown in FIG. 1 in an actual semiconductor integrated circuit device. FIG. 2 is a plan view of a part of the I/O cell 20 having the circuit shown in FIG. 1 in a semiconductor integrated circuit device such as an LSI, illustrating the arrangement of elements in that part. As shown in this figure, between a P-channel MOS transistor 2 and an N-channel MOS transistor 3, not only a diode D1, but also parasitic transistors Q2 and Q3 are formed intentionally. That is, in this embodiment, the diode D1 and the parasitic bipolar transistors Q2 and Q3 are formed in the space that is left unused in the conventional example (FIG. 6).

Figure 3:
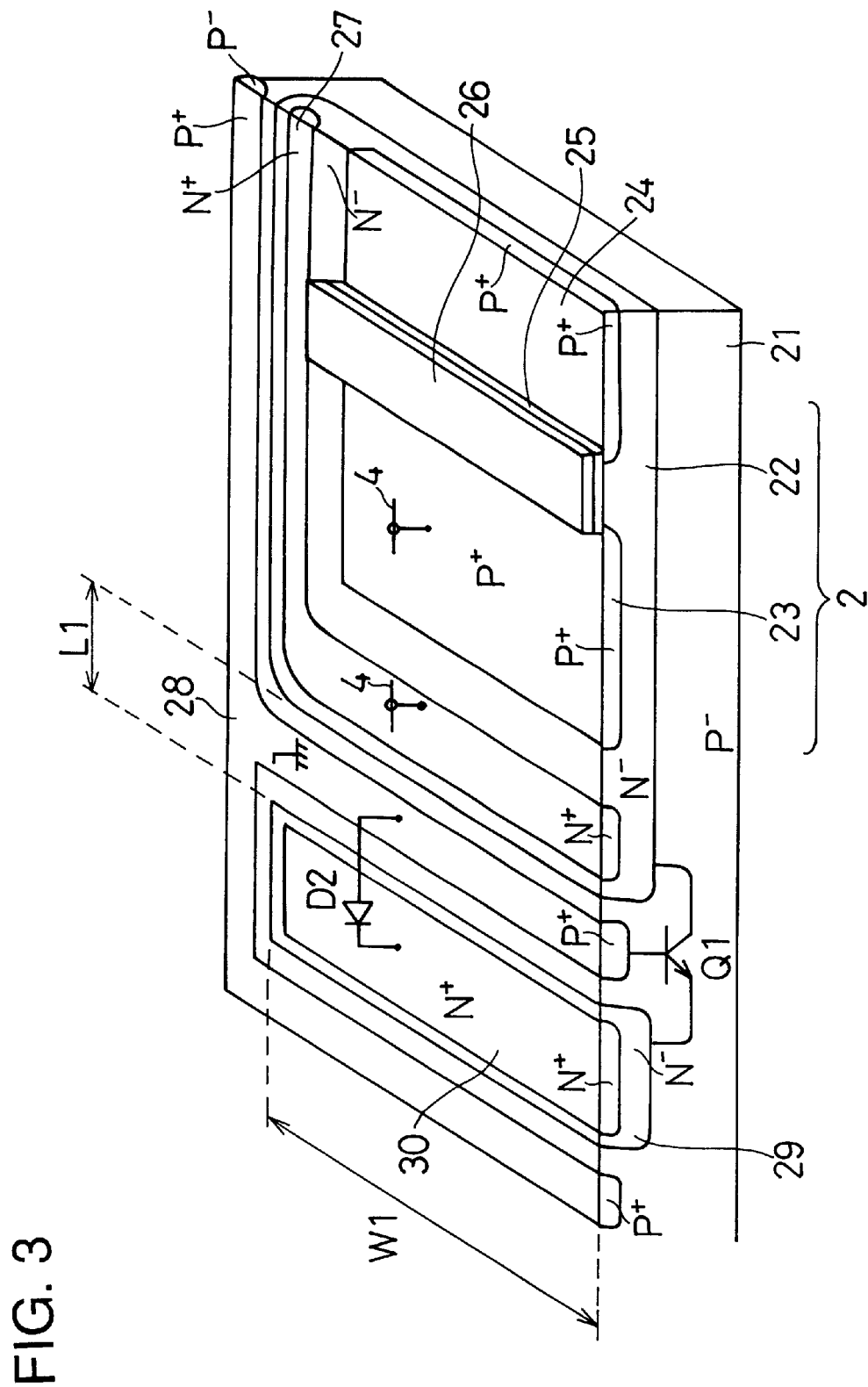
FIG. 3 is a diagram schematically illustrating the structure around the P-channel MOS transistor, the protection diode, and the parasitic first NPN-type transistor of the output circuit of the embodiment.

FIG. 3 is a perspective and partially sectional view of the portion around the P-channel MOS transistor 2, the diode D2, and the transistor Q1, illustrating the structure of that portion. As shown in FIG. 3, the P-channel MOS transistor 2 is formed by forming an N well 22 in a $P^-$ semiconductor substrate 21, forming a source region 23 and a drain region 24 within the N well 22, and laying a gate insulating film 25 made of, for example, $SiO_2$ and a gate electrode 26 on the substrate 21.

An $N^+$ ring layer 27 is formed in the N well 22. A $P^+$ region 28 is formed on the left of the N well 22 as seen from the front-side section in the figure. Further on the left is formed an $N^-$ region 29 having an $N^+$ region 30 formed therein. The $P^+$ region 28 and the $N^+$ region 30 (and also the $N^-$ region 29) constitute the diode D2. The N well 22, the $P^-$ substrate 21 (and also the $P^+$ region 28), and the N-region 29 (and also the $N^+$ region 30) constitute the parasitic transistor Q1.

Figure 4:
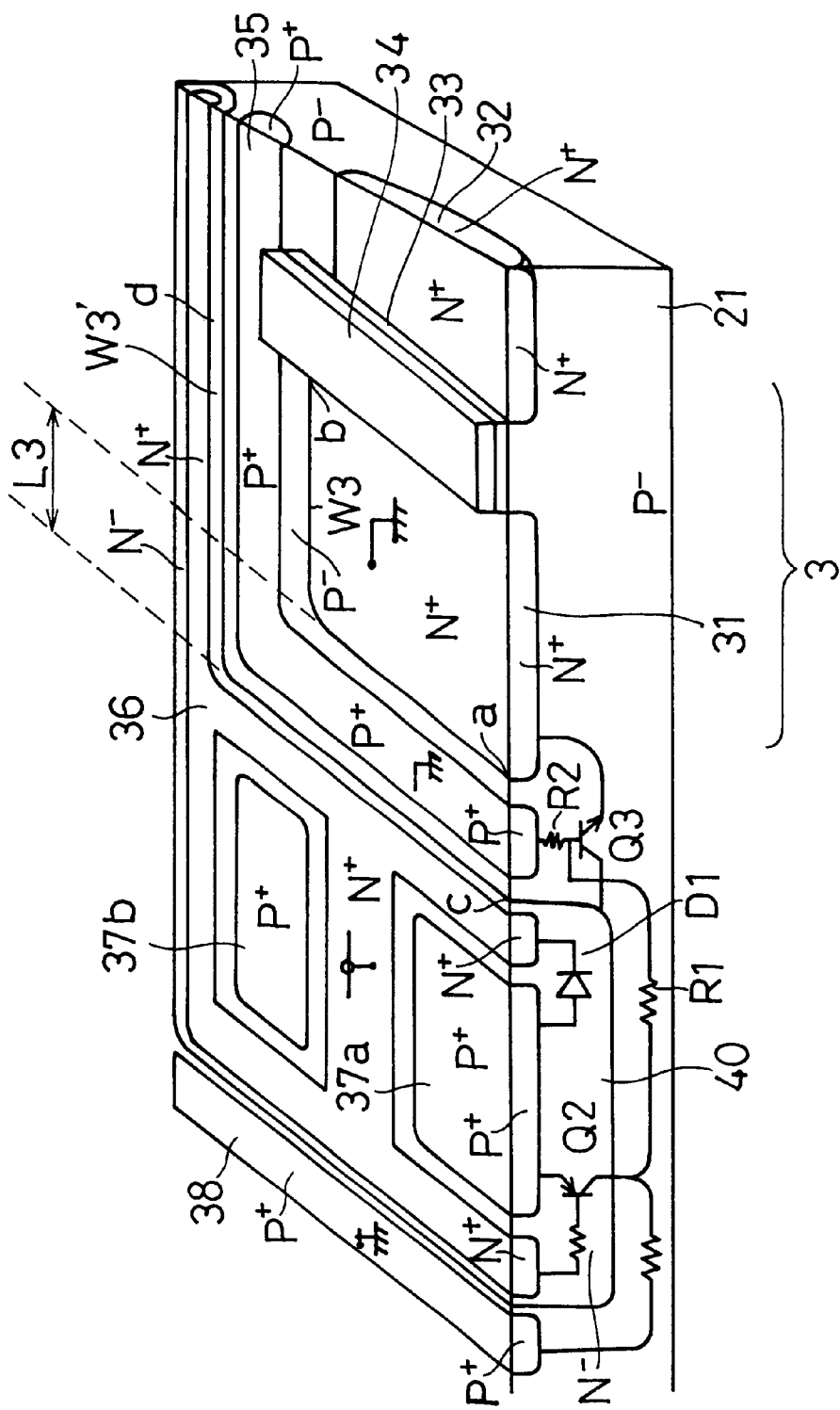
FIG. 4 is a diagram schematically illustrating the structure around the N-channel MOS transistor, the protection diode, and the thyristor circuit of the output circuit of the embodiment.
Figure 5:
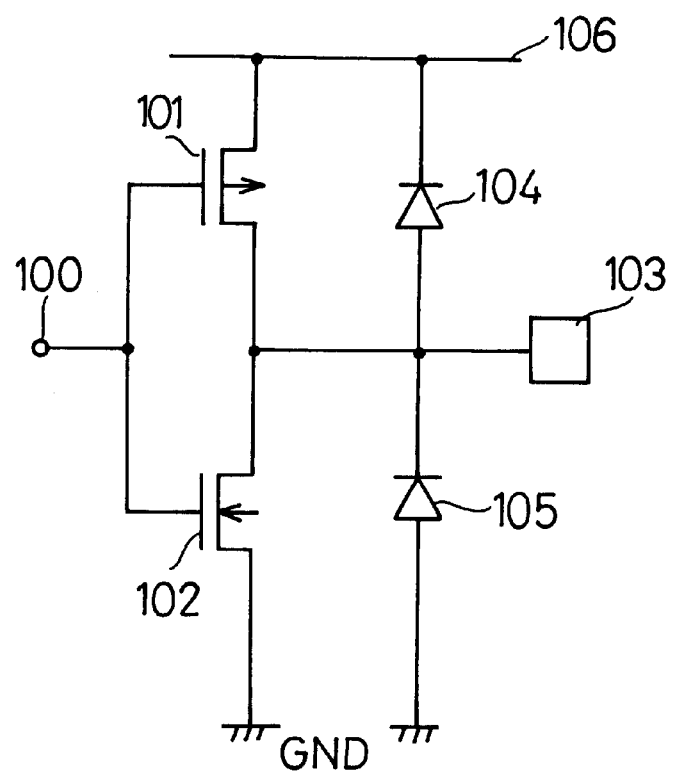
FIG. 5 is a circuit diagram illustrating a conventional example of the output circuit of a semiconductor integrated circuit device.

FIG. 4 is a perspective and partially sectional view of the portion around the N-channel MOS transistor 3, the diode D1, and the transistors Q2 and Q3, illustrating the structure of that portion. As shown in FIG. 4, the N-channel MOS transistor 3 is formed by forming a source region 31 and a drain region 32 in the substrate 21, and laying a gate insulating film 33 and a gate electrode 34 on the substrate 21.

A $P^+$ region 35 is formed on the left of the source region 31 as seen from the front-side section in the figure. Further on the left is formed an N well 40 having a $P^+$ region 37a formed therein. The $P^+$ region 37a (and also 37b) is so formed as to be surrounded by the $N^+$ region 36. These $P^+$ regions 37a and 37b, together with the $N^+$ region 36 surrounding them, constitute the diode D1.

On the left of the $N^-$ well 40 is formed a $P^+$ region 38. The $P^+$ regions 37a and 37b, the N well 40, and the $P^-$ substrate (and also the $P^+$ region 38) constitute the transistor Q2. On the other hand, the N well 40, the $P^-$ substrate (and also the $P^+$ region 35), and the source region 31 constitute the transistor Q3. In addition, the $P^-$ substrate 3 provides resistors R1 and R2 that are connected as shown in the figure.

In FIG. 3, by connecting the base of the parasitic transistor Q1 through the $P^+$ region 28 to ground (i.e. by keeping the base voltage of the transistor Q1 stably at the ground level), it is possible to make the transistor Q1 operate only on the occurrence of electrostatic discharge. That is, under normal conditions, the transistor Q1 never operates.

On the other hand, in FIG. 4, by connecting the base (the $P^-$ substrate) of the parasitic transistor Q3 through the $P^+$ region 35 to ground and thereby keeping its base voltage stably at the ground level, it is possible to make the thyristor circuit 13 operate only on the occurrence of electrostatic discharge, so that it is kept inactive under normal conditions.

Note that, although the resistor R2 between the base of the transistor Q3 and the $P^+$ region 35 is low, when high electrostatic charge causes a large current to flow through the transistor Q2, the voltage across the resistor R2 becomes sufficiently high to turn on the transistor Q3.

In FIG. 3, L1 and W1 represent the length and the width, respectively, of the base of the parasitic NPN-type transistor Q1. The width-to-length ratio is set such that, for example, $W1/L1 \geq 10$. On the other hand, in FIG. 4, L3 represents the length of the base of the parasitic NPN-type transistor Q3, and W3 and W3' represent the width of the base of the same transistor Q3, with W3 representing the inner width (i.e. the width of the L-shaped portion from point a to point b) and W3' representing the outer width (i.e. the width of the L-shaped portion from point c to point d). Here, the inner width W3 is regarded as the effective width of the base. Also here, the width-to-length ratio is set such that $W3/L3 \geq 10$.

For comparison, also in FIG. 6, which shows the conventional example, the base length and width of the parasitic NPN-type transistors Q1 and Q3 are indicated by L1, L3, W1, and W3, respectively. As would be understood from this comparison, in the conventional example, the ratio of the base width to the base length is set to be between 1 and 2, or less than 1, so that the parasitic transistors Q1 and Q3 do not appear (i.e. do not operate). By contrast, according to the present invention, as exemplified in the above-described embodiment, the ratio of the base width to the base length is set to be comparatively large, so that the parasitic transistors operate effectively.

On the other hand, as for the parasitic PNP-type transistor Q2, since it is formed vertically and therefore its effectiveness cannot be judged from its length or width, no comparison is made in the figure. In reality, this transistor Q2 may be formed in much the same way as in the conventional example, because it constitutes a thyristor circuit only in combination with the transistor Q3 and thus, in any case, the effectiveness of the thyristor circuit depends on how differently the transistor Q3 is formed.

According to the present invention, it is possible to strengthen the protection of the output circuit by forming parasitic transistors that operate only in response to electrostatic charge and nonetheless without impairing the operation performed in normal conditions. In addition, since the parasitic transistors are used effectively, it is not necessary to unduly increase the chip area as compared with conventional semiconductor integrated circuit devices.

What is claimed is:

1. A semiconductor integrated circuit device comprising:
   an output circuit of a CMOS composed of a P-channel MOS transistor that has its gate connected to an input terminal, has its source connected to a power source line, and has its drain connected to an output terminal and an N-channel MOS transistor that has its gate connected to said input terminal, has its source connected to ground, and has its drain connected to said output terminal;
   a first protection diode formed in parallel with a source-drain channel of said P-channel MOS transistor;
   a first NPN-type transistorformed so that its base is connected to ground and its collector-emitter path is connected in parallel with the source-drain channel of said P-channel MOS transistor;
   a second protection diode formed in parallel with a source-drain channel of said N-channel MOS transistor; and
   a thyristor circuit formed in parallel with the source-drain channel of said N-channel MOS transistor and operating only when abnormal electrostatic charge is applied to said output terminal;

wherein said thyristor circuit is composed of a PNP-type transistor that has its base connected directly to said power source line, has its emitter connected to said output terminal, and has its collector connected through a resistor to ground and a second NPN-type transistor that has its base connected to said resistor, has its collector connected to the base of said PNP-type transistor, and has its emitter connected to ground.

2. A semiconductor integrated circuit device as claimed in claim 1, wherein said first protection diode and said thyristor circuit are formed between said P-channel MOS transistor and said N-channel MOS transistor on a semiconductor substrate.

3. A semiconductor integrated circuit device as claimed in claim 2, wherein said first protection diode is formed between an N well formed in a P$^-$ substrate and a first P$^+$ region formed within said N well, wherein said PNP-type transistor of said thyristor circuit is formed as a parasitic transistor by said first P$^+$ region, said N well, and said P$^-$ substrate, and wherein said second NPN-type transistor of said thyristor circuit is formed as a parasitic transistor by a source region of said N-channel MOS transistor, said P$^-$ substrate, and said N well.

4. A semiconductor integrated circuit device as claimed in claim 3, wherein said second protection diode is formed by a second P$^+$ region and an N$^+$ region formed in said P$^-$ substrate, and said first NPN-type transistor is formed as a parasitic transistor by said second P$^+$ region, said N$^+$ region, and said N well for said P-channel MOS transistor.

5. A semiconductor integrated circuit device as claimed in claim 2, wherein said first protection diode is formed by an N well formed in a P$^-$ substrate and a first P$^+$ region formed within said N well, wherein said PNP-type transistor of said thyristor circuit is formed as a parasitic transistor by said P$^+$ region, said N well, and said P$^-$ substrate, and wherein said second NPN-type transistor of said thyristor circuit is formed as a parasitic transistor by a source region of said N-channel MOS transistor, said P$^-$ substrate, and said N well.

6. A semiconductor integrated circuit device as claimed in claim 5, wherein said second protection diode is formed by a second P$^+$ region and an N$^+$ region formed in said P$^-$ substrate, and said first NPN-type transistor is formed as a parasitic transistor by said second P$^+$ region, said N$^+$ region, and said N well for said P-channel MOS transistor.

* * * * *